(12) United States Patent  (10) Patent No.: US 8,872,335 B2
Huebner et al.  (45) Date of Patent: Oct. 28, 2014

(54) ELECTRONIC DEVICE AND METHOD OF MANUFACTURING SAME

(75) Inventors: Holger Huebner, Baldham (DE); Martin Franosch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 177 days.

(21) Appl. No.: 11/781,282

(22) Filed: Jul. 23, 2007

(65) Prior Publication Data

US 2009/0026607 A1  Jan. 29, 2009

(51) Int. Cl.
  *H01L 23/48* (2006.01)
  *H01L 23/31* (2006.01)
  *H01L 21/56* (2006.01)
  *H05K 3/30* (2006.01)
  *H01L 23/00* (2006.01)
  *H01L 23/498* (2006.01)
  *H05K 3/28* (2006.01)

(52) U.S. Cl.
  CPC ...... *H05K 3/305* (2013.01); *H01L 2924/01005* (2013.01); *H01L 2924/01033* (2013.01); *H01L 2224/2919* (2013.01); *H01L 2224/32225* (2013.01); *H01L 24/17* (2013.01); *H01L 23/3128* (2013.01); *H01L 2924/01019* (2013.01); *H01L 2224/73104* (2013.01); *H01L 21/563* (2013.01); *H01L 2224/13022* (2013.01); *H05K 2203/0783* (2013.01); *H01L 2224/83191* (2013.01); *H05K 2201/10674* (2013.01); *H01L 2224/81815* (2013.01); *H01L 2924/10253* (2013.01); *H01L 2224/13099* (2013.01); *H01L 2224/73204* (2013.01); *H01L 2924/14* (2013.01); *H01L 2224/81193* (2013.01); *H01L 24/16* (2013.01); *H01L 2224/16225* (2013.01); *H01L 2924/12044* (2013.01); *H01L 2924/01006* (2013.01); *H01L 2924/01082* (2013.01); *H01L 23/49816* (2013.01); *H01L 24/90* (2013.01); *H01L 2924/01029* (2013.01); *H05K 2203/306* (2013.01); *H01L 2224/83862* (2013.01); *H01L 2224/8383* (2013.01); *H01L 24/81* (2013.01); *H01L 2224/83194* (2013.01); *H01L 2924/01078* (2013.01); *H01L 24/12* (2013.01); *H01L 2924/014* (2013.01); *H01L 2224/8121* (2013.01); *H01L 2924/01068* (2013.01); *H01L 2924/0665* (2013.01); *H01L 2924/01079* (2013.01); *H01L 24/83* (2013.01); *H05K 2201/10977* (2013.01); *H01L 2924/09701* (2013.01); *H05K 3/284* (2013.01)
  USPC .... 257/737; 257/787; 257/777; 257/E23.021; 257/E21.503

(58) Field of Classification Search
  CPC .......... H01L 2924/01079; H01L 2224/13099; H01L 2924/01029; H01L 23/52; H01L 33/48
  USPC .......... 257/787, 737, 777, E23.021, E21.503
  See application file for complete search history.

(56) References Cited

U.S. PATENT DOCUMENTS

| | | | |
|---|---|---|---|
| 6,365,840 B1 * | 4/2002 | Honda et al. | 174/259 |
| 2006/0060987 A1 * | 3/2006 | Chen et al. | 257/787 |
| 2006/0134901 A1 * | 6/2006 | Chaware et al. | 438/612 |
| 2006/0147719 A1 * | 7/2006 | Rubinsztajn et al. | 428/413 |
| 2007/0182019 A1 * | 8/2007 | Nishimura | 257/777 |
| 2007/0284758 A1 * | 12/2007 | Zhang et al. | 257/780 |

* cited by examiner

*Primary Examiner* — Dale E Page

(74) *Attorney, Agent, or Firm* — Dicke, Billig & Czaja, PLLC

(57) ABSTRACT

It is proposed a method of manufacturing an electronic system wherein a first substrate comprising first connection elements on a first surface of the first substrate is provided; a second substrate comprising second connection elements on a first surface of the second substrate is provided; a polymer layer is applied to at least one of the two first surfaces; the first connection elements are attached to the second connection elements; and the polymer layer is caused to swell during or after the attachment.

21 Claims, 5 Drawing Sheets

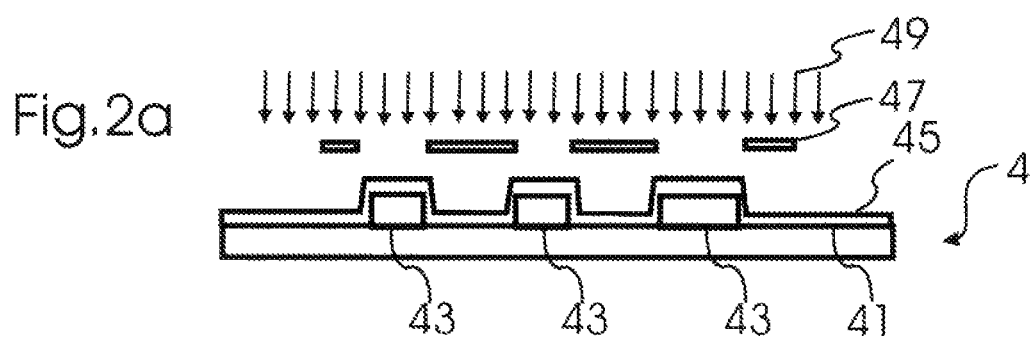
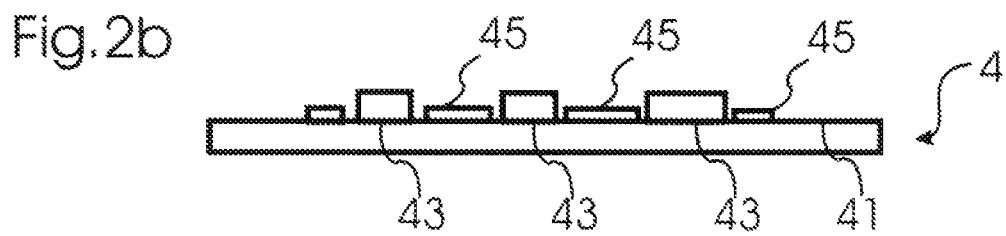
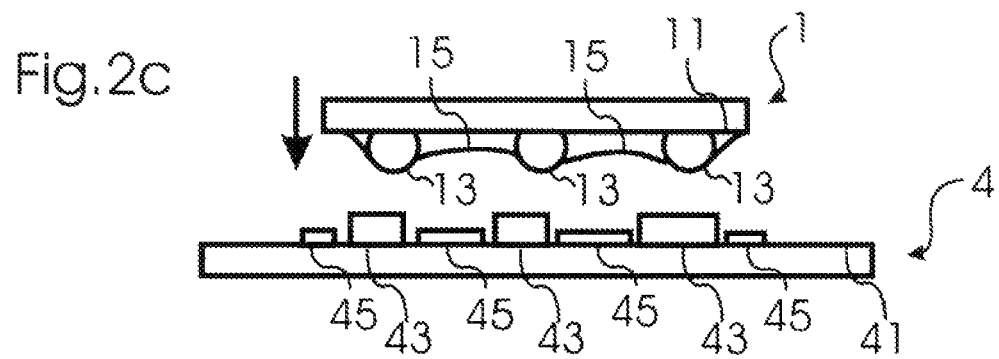
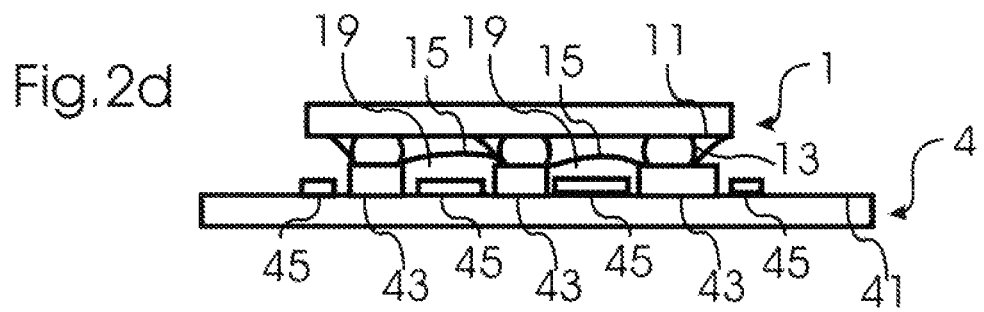
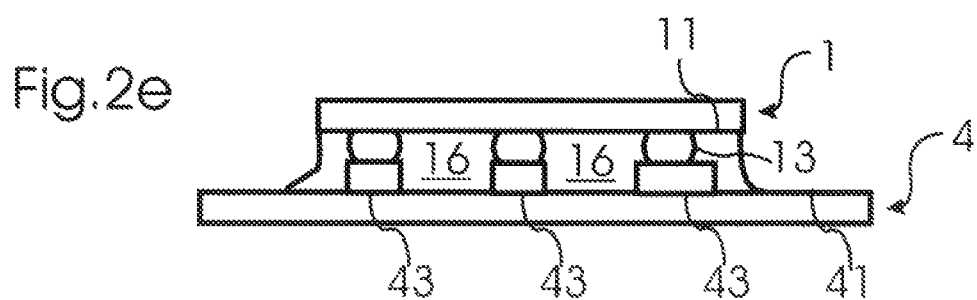

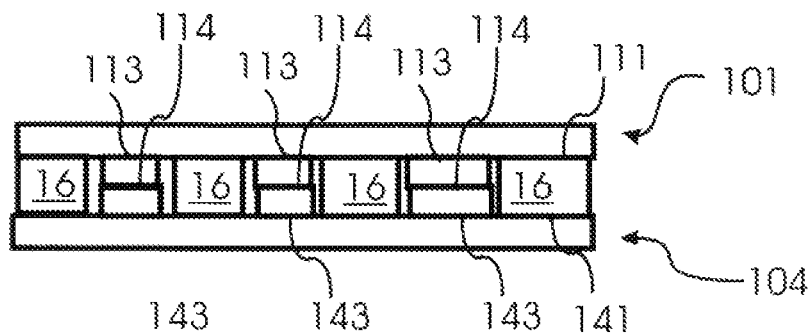
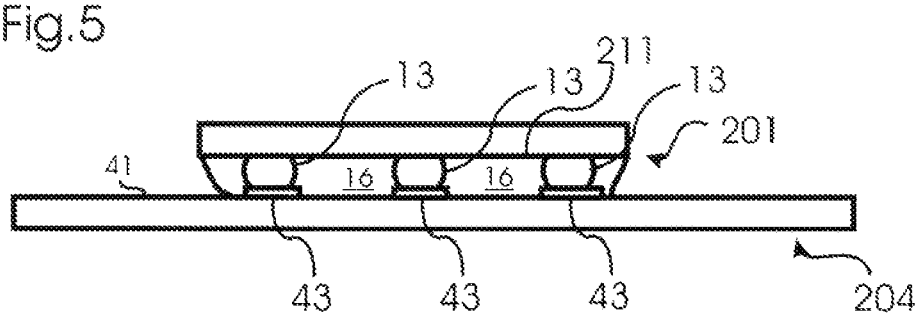
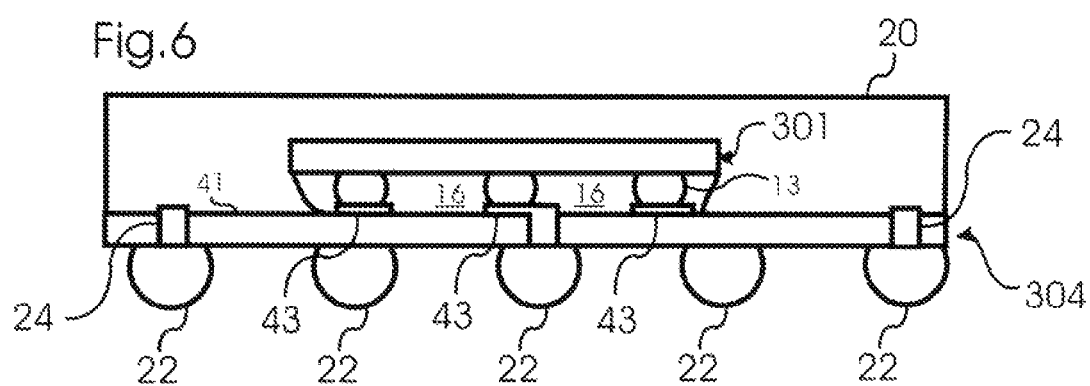

ELECTRONIC DEVICE AND METHOD OF MANUFACTURING SAME

FIELD OF THE INVENTION

The present invention relates to an electronic system, and a method of manufacturing the electronic device.

BACKGROUND

There is an ongoing effort in making electronic devices more intelligent, more powerful, less energy consuming, and more compact. This effort has lead to reduce the structure size of integrated circuits to a scale smaller then 100 nm. In view of this evolution, it has become a challenge to connect integrated circuits to an outside world that usually deals with a scale of the size of the human body. Packaging is seeking to bridge this scale difference. For example, by attaching and wire bonding an integrated circuit to a leadframe, the small wire bond pads of an integrated circuit are electrically connected to the leads of the leadframe that in turn are solderable to the larger pads of a printed circuit board of an electronic appliance. Further, by encapsulating the integrated circuit with a mould material, the fragile integrated circuit and bond wires are protected from the environment.

In order to increase functionality of integrated circuits, bonding wires have often been replaced by bumps placed on the chip surface. Using bumps helps increasing the number of input/output channels for a given integrated circuit area. Further, to increase functionality density, stacking of integrated circuits one atop the other, before molding the stack, has been introduced.

Bump bonding, as well as stacking chips or substrates, pose several challenges. For this and other reasons, there is a need for the invention disclosed below.

SUMMARY

It is disclosed a method of manufacturing an electronic system comprising:
providing a first substrate comprising first connection elements on a first surface of the first substrate; providing a second substrate comprising second connection elements on a first surface of the second substrate; applying a polymer layer to at least one of the two first surfaces; attaching the first connection elements to the second connection elements; and causing the polymer to swell during or after the attachment.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 2a-2e disclose a further method wherein, before swelling, the polymer layer is applied to a first and a second substrate.

FIG. 4 discloses an embodiment wherein a swollen polymer layer adheres to a first wafer and a second wafer.

FIG. 5 discloses an embodiment wherein a swollen polymer layer adheres to a semiconductor chip and a printed circuit board.

FIG. 6 discloses an embodiment wherein a swollen polymer layer adheres to a semiconductor chip and an interposer.

DETAILED DESCRIPTION OF THE DRAWINGS

Figure 1A:
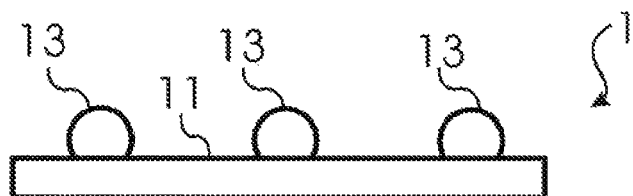
FIGS. 1a-1e disclose a first method wherein, before swelling, the polymer layer is applied to only one substrate.

FIGS. 1a-1e disclose five steps according to a first method of manufacturing an electronic system that facilitates an attachment of a first substrate 1 to a second substrate 4. The method is applicable to a large variety of substrates. For example, first substrate 1 may be a semiconductor chip or semiconductor device that is to be attached to a second substrate 4, e.g. an interposer, ceramic substrate, laminate substrate, glass substrate, a leadframe, a semiconductor substrate (chip or wafer), an encapsulated integrated circuit, an epoxy laminate (FR4), or a printed circuit board. Also, the other way around, first substrate 1 may be any of the substrates that the second substrates 4 can be. For the sake of clarity, FIGS. 1a-1e will be described as representing the mounting of a semiconductor chip to a printed circuit board.

First substrate 1 (semiconductor chip) comprises first connection elements 13 on a first surface 11 of the semiconductor chip 1. The connection elements may be an array of metal elements protruding from the first surface and having the shape of balls, pillars, pads, bumps or, in particular, solder balls or solder bumps. The connection elements 13 are rigidly attached to the semiconductor chip 1. The application of the connection elements 13 onto the semiconductor chip 1 may be conducted using conventional methods, like plating, solder paste printing, sputtering, or lift-off.

The sizes of the connection elements 13 may well vary between some micrometers, e.g. 5 micrometers, and 1000 micrometers, depending on the application. In the present case, when mounting a chip to a printed circuit board, the connection elements 13 are usually solder bumps having diameters of typically 400 micrometers. The producing of the solder bumps is preferably done on the wafer level, i.e. the wafer is cut into individual chips only after the production of the solder bumps. Usually, the connection elements 13 serve as input/output terminals that are connected to some electronic circuit, conducting lines, etc., integrated in semiconductor chip 1.

Figure 1B:
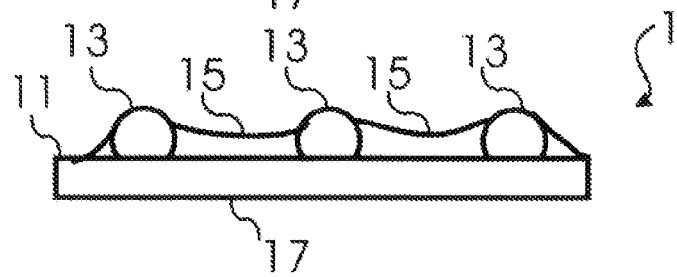

FIG. 1b illustrates a further step wherein a polymer layer 15 has been deposited onto the first surface 11 of the semiconductor chip 1. Again, it is preferred that the deposition of the polymer layer is done on the wafer level to have multiple chips on the wafer covered with the polymer layer 15 in parallel. As indicated in FIG. 1b, it is further preferred that the polymer layer 15 covers the connection elements 13 only partially, or not at all. This is to make sure that the connection elements 13 are exposed to make an electrically conducting connection when placing the chip 1 onto second substrate 4. However, depending on the type of connection element and on the type of polymer, the polymer layer 15 may cover the connection elements 13 completely if, during the attachment of the first connection elements 13 to the second connection elements 43, the polymer layer 15 is removed in the contact region. For example, the polymer layer 15 in the contact regions of the first connection elements 13 and the respective second connection elements 43 may be removed by, e.g., pressure or friction exerted by the first connection elements 13 and the second connection elements 43 on the polymer layer.

Figure 1C:
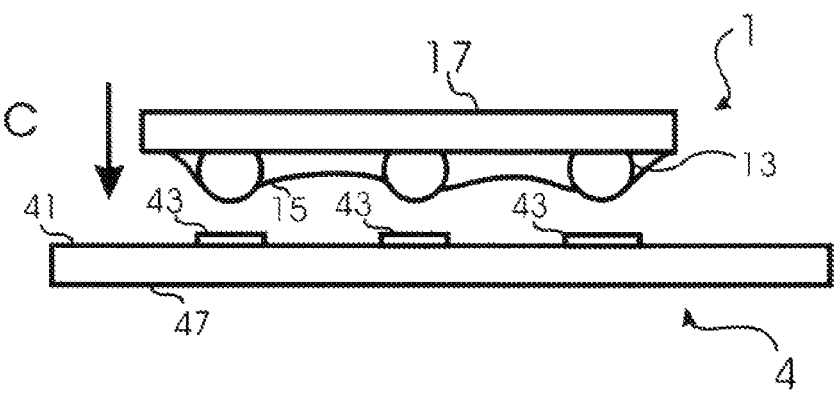

FIG. 1c discloses schematically the step wherein the semiconductor chip 1 is turned upside down and moved towards the first surface 41 of the second substrate 4 (printed circuit board (PCB)) to connect first connection elements 13 with second connection elements 43. The second connection elements 43 may be, for example, copper pads printed onto the printed circuit board. As shown in FIG. 1c, the positions of the copper pads 43 are matched to the positions of the solder bumps 13 to make sure that each second copper pad 43 makes electronic contact with a respective solder bump 13 when placing the semiconductor chip 1 onto the PCB 4.

Figure 1D:
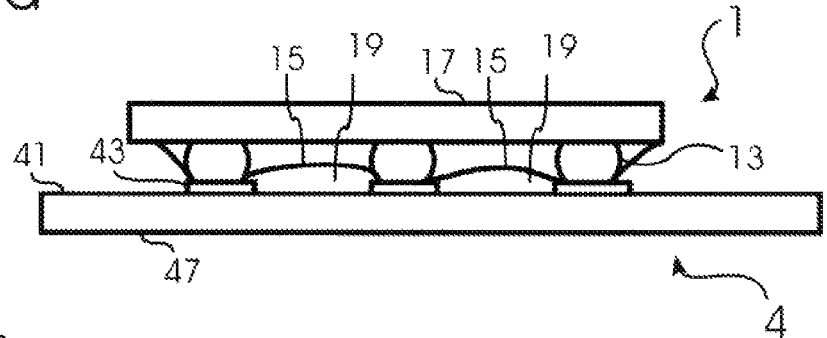

FIG. 1d schematically illustrates the situation wherein the solder bumps 13 are rigidly connected with copper pads 43. The two may be attached to each other by placing the two substrates on top of each other and introducing the two into an oven. The oven temperature needs to be high enough to make sure that the solder bumps 13 begin to melt such that the solder bumps 13 rigidly connect with the copper pads 43. Depending on the solder material, typical soldering temperatures are in a region between 100° C. and 400° C.

Note that during the solder process, polymer layer 15 is hardly, or not at all, in contact with the PCB 4. This is due to the fact that the solder bumps 13 protrude through the polymer layer 15 (see FIG. 1b). As a consequence, when placing the semiconductor chip 1 onto PCB 4, a gap 19 between PCB 4 and polymer layer 15 is generated that makes sure that during soldering, polymer layer 15 of semiconductor 1 does not adhere to the PCB 4. This way, chip 1 is free to float during the soldering. This way, thermo-mechanical stress generated between the first substrate 1 (semiconductor chip) and the second substrate 4 (PCB) during soldering is kept small.

In addition, gap 19 between chip 1 and PCB 4 makes sure that the surface of polymer layer 15 is accessible for a fluid or gaseous solvent. This may be important for the subsequent step that causes the polymer layer to swell.

Note that, besides soldering, the attachment of the first connection elements 13 with the second connection elements 43 can also be carried out with other conventional methods depending on the type of substrate and the type of connection elements. Such attachment processes may be, for example, diffusion soldering, welding, gluing, and the like. Also, as will be described later, it is possible to keep the respective facing first and second connection elements 13, 43 in mere mechanical contact, i.e. without gluing, welding, soldering, etc., since it may be sufficient to have the polymer layer 15 make the first substrate 1 adhere to the second substrate 4.

Figure 1E:
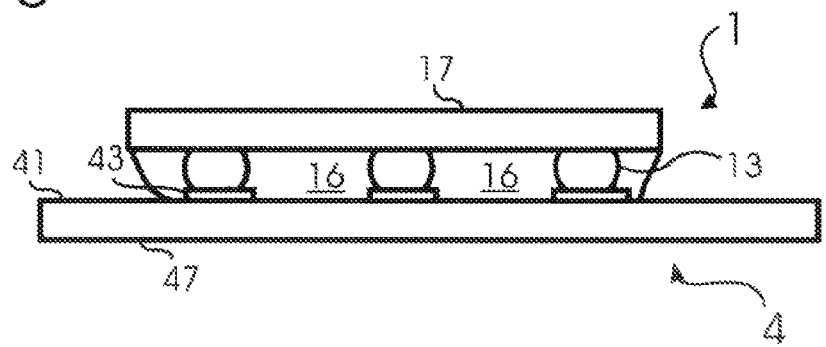

FIG. 1e discloses the result of a further step of the method wherein polymer layer 15 has been caused to swell to become a swollen polymer layer 16. As shown in FIG. 1d, with the swelling of polymer layer 15, the polymer expands to fill the gap 19 and reach the first surface 41 of PCB 4. When reaching the first surface 41, for reasons described in more detail below, the polymer layer 15 also bonds to the first surface 41 of the PCB 4. This way, once the swollen polymer layer 16 (previously polymer layer 15) has hardened again, the swollen polymer layer 16 can support the connection elements 13, 43 holding the first substrate 1 to the second substrate 4. Further, since the swelling of polymer layer 15 eliminates gap 19 between the first substrate 1 and the second substrate 4, corrosion of the connection elements 13, 43, delamination and other reliability problems of electronic devices can be eliminated.

As it turns out, the swelling of the polymer layer may also help reducing the thermo-mechanical stress resting on the connection elements during thermal cycling caused in the process of device manufacturing or device operation. Thermo-mechanical stress arises when the materials of the two substrates 1, 4 have deviating coefficients of thermal expansion (CTE). In this case, during thermal cycling, the substrates 1, 4 expand or shrink at different rates. Due to the rigidity of the connections between the first and second connection elements 13, 43, the thermo-mechanical stress may lead to shear forces on the connection elements 13, 43 that can break the connections. As it turns out, depending on the choice of polymer material and on the type of surfaces of the substrates, a swollen polymer layer 16 between the first and second substrates 1, 4 can absorb some of the shear forces and, therefore, lower the destructive forces on the connection elements.

The swelling of the polymer layer 15 may be caused by applying a fluid or gaseous agent to the polymer layer. By choosing an agent that weakens the bonding of the polymer molecule chains, the volume of the polymer increases if exposed to the agent. Further, as it turns out, the broken molecule chains of the expanding polymer can be sufficient reactive to bond well with other surfaces. This may be seen as a reason for the polymer layers to bond well with the first surfaces of the substrates when swelling. This effect is also known as "solvent welding". The "solvent welding" may be the basis for the observation that the shear forces between the first and second connection elements 13, 43 decrease when swelling the polymer layer 15 between the first and second substrates 1, 4.

Note that it is the gap 19 between the first substrate 1 and the second substrate 2 that provides an easy access for the fluid or gaseous agents to reach and diffuse into the polymer layer 15 efficiently. Further, it is because of the gap 19 that the swelling process is also a self-limiting process since, after the gap 19 has been filled with the swollen polymer; the agents that cause the swelling cannot reach the surface of the polymer layer anymore. The self-limiting process prevents that the swelling polymer layer 15 can break the connection elements when expanding against the first and the second substrates. In order to form gaps 19 between the first and the second substrate 1, 4, the first connection elements 13 extend through the polymer layer 15 when placing the first substrate 1 onto the second substrate 4.

There are several options for selecting a polymer layer that is capable of swelling. In one embodiment, polymethyl methacrylate (PMMA) or poly (methyl 2-methylpropenoate) is used as polymer for the polymer layer. After attaching the first and second substrates with each other, the PMMA may be exposed, for example, to benzene, methyl chloride, acetone, or ethyl acetate, to swell. For example, exposing PMMA to acetone can make the volume of the polymer increase by 10 Vol. %.

In another embodiment, polyvinyl chloride (PVC) may be used as polymer for the polymer layer. After attaching the first and second substrates with each other, the PVC may be exposed, for example, to acetone to swell. In this case, the PVC may swell by 50 Vol %.

In a further embodiment, polycarbonate (PC) may be used as polymer for the polymer layer. After attaching the first and second substrates with each other, the PC may be exposed, for example, to methyl chloride to cause the polycarbonate to swell.

In another embodiment, polyimide may be used as polymer for the polymer layer. After attaching the first and second substrates with each other, the polyimide may be exposed, for example, to hydrazine to cause the polyimide to swell.

In another embodiment, polyurethane (PUR) may be used as polymer for the polymer layer. After attaching the first and second substrates with each other, the PUR may be exposed, for example, to methyl chloride, acetone, ethyl acetate, or tetrahydrofurane, to cause the polyurethane (PUR) to swell.

The exposure time of the polymer layers to the respective agents depends on the time it takes for the solvent to diffuse through the full volume of the polymer layer, e.g. on the thickness of the polymer layer, and on the concentration for the solvent. Also, the exposure time may be chosen to meet a certain swelling percentage. Generally, the swelling should increase the polymer volume by more than 5 Vol. %. On the other hand, if the polymer layer is exposed to a solvent too long, the polymer may dissolve completely and disappear from the substrates. Generally, choosing the right exposure time and concentration of the solvents depends on the details of the set-up and is within the scope of what a skilled person does routineously.

In order to even stronger tighten a first substrate 1 to a second substrate 4, the two may further be exposed to a drying process that drives the solvent out of the polymer layer 15. The drying can be accelerated by exposing the swollen polymer layer to a heightened temperature, e.g. above room temperature, and/or a reduced pressure. The drying of the polymer leads to a shrinkage of the polymer layer volume that, due to the good adhesion of the polymer to the substrate surfaces, pulls the two substrates to each other. This further reduces the forces resting on the connection elements 13, 43.

FIGS. 2a-2e disclose five steps according to a further method for attaching a first substrate 1 to a second substrate 4. Again, the method is applicable to a large variety of substrates. Again, for example, first substrate 1 may be a semiconductor chip or semiconductor device that is to be attached to a second substrate 4, e.g. an interposer, ceramic substrate, laminate substrate, glass substrate, a leadframe, a semiconductor substrate (chip or wafer), an encapsulated integrated circuit, an epoxy laminate (FR4), or a printed circuit board. Also, the other way around, first substrate 1 may be any of the substrates that the second substrates 4 can be. Again, for the sake of clarity, FIGS. 2a-2e will be described as representing a mounting of a semiconductor chip to a printed circuit board.

FIGS. 2a-2e illustrate a method that is essentially the same as the one shown in FIGS. 1a-1e. However, FIGS. 2a-2e differ from FIGS. 1a-1e in that, in addition to a first polymer layer 15 applied to a semiconductor chip 1, there is also a second polymer layer 45 applied to the PCB 4. This way, when swelling the first polymer layer 15 towards the first surface 41 of the PCB 4, the second polymer layer 45 swells towards the first surface 11 of semiconductor chip 1. As a result, the two polymer layers 15, 45 unite to form a single swollen polymer layer 16.

FIG. 2a discloses exemplary a first step according this method wherein, after application of a photo-sensitive first polymer layer 45 to second substrate 4 (PCB), a photolithographic step is conducted to structure the photo-sensitive second polymer layer 45. The structuring of the photo-sensitive polymer layer 45 is to remove the polymer 45 from the connection elements 43. In this embodiment, the photo-sensitive second polymer layer 45 may be, for example, polymethyl methacrylate (PMMA) or poly (methyl 2-methylpropenoate). PMMA is a positive photo-sensitive material that becomes soluble once it has been exposed to radiation with a wave length smaller than 250 nm. By using a mask 47 and an appropriate light source 49, the PMMA can be made soluble selectively in regions that cover the connection elements 43.

This way, after washing the PCB 4 and the illuminated PMMA layer in a developer, the connection elements 43 are opened again (FIG. 2b).

FIG. 2c discloses the step of placing a first substrate 1 onto the PCB 4. Like for the method according to FIGS. 1a-1e, first substrate 1 may be a semiconductor chip, wafer, or semiconductor device that is to be attached to the PCB. It may also be an interposer, ceramic substrate, laminate substrate, glass substrate, a leadframe, an encapsulated integrated circuit, an epoxy laminate (FR4), or a printed circuit board. Further, a first polymer layer 15 has been applied to the first surface 11 of the semiconductor chip 1 in the same way as described in FIG. 1b. For the sake of clarity, it is assumed that in FIGS. 2c-2e, first substrate 1 is a semiconductor chip 1 as described in FIGS. 1a-1e. Further, for the sake of clarity, it is assumed that in FIGS. 2c-2e, the first polymer layer 15 is the same material as the second polymer layer 45, i.e. PMMA.

FIG. 2d discloses a situation after having soldered the semiconductor chip 1 to the PCB in the same way as described in FIG. 1d. Note that after soldering, again, a gap 19 between the first polymer layer 15 (first PMMA layer) and the second polymer layer 45 (second PMMA layer) has been formed. This is due to the fact that in most regions, the sum of the layer thicknesses of the first PMMA layer 15 and the second PMMA layer 45 is smaller than the sum of the height of the solder bumps 13 protruding from the first surface 11 and the thickness of the copper pads 43. For example, in the present example, the height of the solder bumps 13 may be 200 micrometers, and the height of the first PMMA layer 15 between the solder bumps 13 may be only 180 micrometer in some regions. Equally, the thickness of the second polymer layer 45 may be 180 micrometer while the thickness of the pads 43 may be 200 micrometers. With gap 19 between chip 1 and PCB 4 it is made sure that the surfaces of first polymer layer 15 and second polymer layer 45 are accessible for gaseous or fluid solvents to make the polymer layers swell until the respective other polymer layers 15, 45 have bonded to each other.

FIG. 2e discloses a further step after the polymer layers 15, 45 have been swollen to reunite to a single swollen polymer layer 16 adhering to the semiconductor chip 1 and the PCB 4.

As was described earlier, it is now possible to dry the polymer layer 15. As mention before, this can be done by a temperature step, e.g. inserting the substrates 1, 4 with the swollen polymer layer 16 in an oven at a temperature of, say, above room temperature. When drying the swollen polymer layer 16, the polymer layer may shrink and, as a consequence, pull the first substrate 1 towards the second substrate 4. This force may help absorbing some of the shear forces that otherwise would rest on the connection elements 13, 43 alone.

Figure 3A:
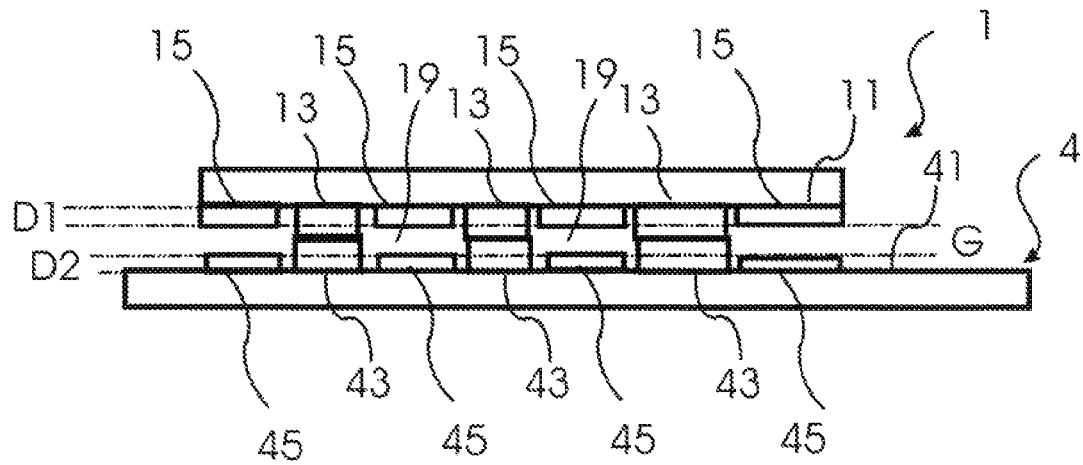
FIGS. 3a-3c disclose a further method wherein, before swelling, the polymer layer is structured by a photolithographic process on both a first and a second substrate.
Figure 3B:
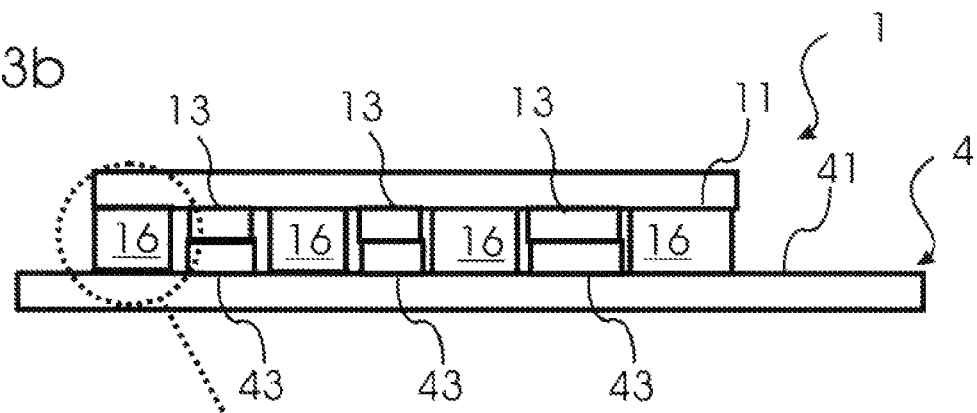

FIGS. 3a-3b disclose a further method of attaching a first substrate 1 to a second substrate 4. Again, the method is applicable to a large variety of substrates. For example, first substrate 1 may be a semiconductor chip or semiconductor device that is to be attached to a second substrate 4, e.g. an interposer, ceramic substrate, laminate substrate, glass substrate, a leadframe, a semiconductor substrate (chip or wafer), an encapsulated integrated circuit, an epoxy laminate (FR4), or a printed circuit board. Also, the other way around, first substrate 1 may be any of the substrates that the second substrates 4 can be. Again, for the sake of clarity, FIGS. 3a-3b will be described as representing the mounting of a semiconductor chip 1 to a printed circuit board 4 (PCB).

The method according to FIGS. 3a-3b is essentially the same as the one shown in FIGS. 2a-2e. For example, it includes the steps of applying a first polymer layer 15 to the first substrate 1, e.g. a semiconductor chip; applying a second polymer layer 45 to the second substrate 4, e.g. a printed circuit board (PCB); attaching the first connection elements 15 to the second connection elements 45; and causing the first polymer layer 15 and the second polymer layer 45 to swell during or after the attachment.

However, the method according to FIGS. 3a-3b differs from the one of FIGS. 2a-2e in that both polymer layers 15, 45 have been structured to remove the polymer from the first and second connection elements 13, 43. This is to make sure that the first and second connection elements 13, 43 are reliably electrically connected to each other when placed onto each other. Further, with the structuring, both polymer layers 15, 45 can be made to have defined layer thicknesses, D1 and D2, before the swelling. As a result, the gap 19 between the two polymer layers 15, 45 also has a defined width G.

Generally, as it turns out, the attachment of the first substrate 1 to the second substrate 4 by the swelling polymer layers 15, 45 is the tighter the smaller the ratio of the gap width G to the sum of the polymer layer thicknesses D1 and D2 is, before the swelling. In FIG. 3a, for example, the first and second connection elements 13, 43 may each have a thickness of 100 micrometer, while the first and second polymer layers 15, 45 may each have a thickness of only 90 micrometer. Accordingly, the thickness of the gap G is 20 micrometer. Therefore, for making contact between the first and the second polymer layer, the first and second polymer layers need to swell by 10 Vol. %. Note that the dimensions for the layer thickness and gap size depend also on how well the layer thickness can be controlled and by how much the polymer layers can swell.

After swelling, the two polymer layers 15, 45 have joint to form a single swollen polymer layer 16 that is tightly bonded to the surfaces of the first and second substrates 1, 4. Further, after a drying process during which the swollen polymer layer 16 shrinks, the swollen polymer layer 16 exerts a permanent force to the first and second substrates 1, 4 towards each other. This force helps absorbing some of the shear forces that otherwise would rest on the connection elements 13, 43 during the temperature cycles that electronic devices undergo during manufacture and operation.

Figure 3C:
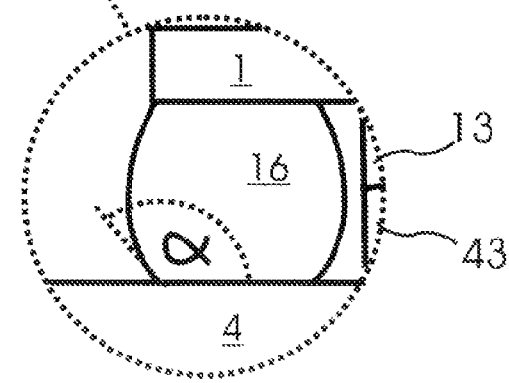

Note that the swollen polymer layer 16 between first and second substrates 1, 4 is distinguished over conventional underfill material in that the sidewalls of the polymer layer may extend from the first surfaces 1, 41 of the first or second substrate at a protruding angle α equal or larger than 55 degrees with respect to the respective first surface 1, 41. As indicated in the blow-up perspective of FIG. 3c, the protruding angle α is taken to enclose the polymer layer material 16. In FIG. 3c, the protruding angle α is about 120 degrees which gives the sidewall a convex shape. The large protruding angle α is due to the swelling of the polymer layer. On the other hand, due to a shrinking volume, the protruding angle α in FIG. 3c may become smaller after the polymer layer 16 has been dried. In this case the protruding angle may become smaller than 90 degrees so that the convex shape of the sidewalls shown in FIG. 3c turns into a concave shape.

Still, even after the drying the polymer layer, the protruding angle α of the swellable polymer layers is larger than the protruding angle of an underfill material that has been introduced between the first and second substrate by capillary forces.

The method according to FIGS. 3a-3b also differs over FIGS. 2a-2e in that the connection elements 13 of the first substrate 1 are pads, e.g. copper pads, instead of solder bumps. The attachment of the first pads 13 to the second pads 43 may be carried out in various ways, for example by welding. Alternatively, the welding may be left out since it may be sufficient to have the swollen polymer layer 16 alone tie the first substrate 1 to the second substrate 4. Due to the shrinking of the swollen polymer layer 16, the first and second connection elements 13, 43 are sufficiently pressed against each other to make a reliable electric contact. Note that, if connecting the first pads 13 to the second pads 43 without welding, it may be advantageous to cover the pads with a layer of gold to avoid corrosion of the pad surfaces and to provide for a good electric contact between the two pads.

The methods described above illustrate only specific embodiments that may be changed or combined in various ways without departing from the scope of the invention. For example, some of the processes, while described above as separate steps, may be carried out at the same time, or within the same processing machine. For example, soldering of the connection elements, as well as swelling and drying of the polymer layer may be carried out in an oven that promotes the soldering process by heating the electronic device, delivers the agents for swelling the polymer layers and, after pumping the agents out of the oven, delivers the heat necessary for drying the swollen polymer layer.

Further, for example, the swelling of the polymer layers can also be induced in ways other than those described above. For example, instead of using a solvent for swelling the polymer layer 15, a chemical may be used to cause the polymer to swell. Also, as mentioned before, the chemicals or agents may be introduced to the polymer layer in gaseous form or by a fluid, e.g. by introducing the electronic device into a bath that contains the respective agent or chemical. Further, the polymer layer 15 may be a layer that, before attaching the first connection elements 13 to the second connection elements 43, is pressed together and swells already by the mere application of heat.

FIGS. 4-6 illustrate some of the many electronic devices that can be manufactured with the methods described above.

FIG. 4 is a schematic drawing showing a first wafer 101 having a first surface 111 attached to the first surface 141 of a second wafer 104. The two wafers are electrically connected with each other via the first connection elements 113 and second connection elements 143 that touch each other at soldered joints 114. FIG. 4 further discloses a swollen polymer layer 16 adhering to the first surface 111 of first wafer 101 and to the first surface 141 of second wafer 104. The swollen polymer layer 16 may be produced in a way as described for FIGS. 3a-3b. The swollen polymer layer 16 supports the connection elements 113, 143 to hold the first wafer 101 to the second wafer 104.

Note that, while in FIG. 4 the polymer layer 16 and the connection elements 113, 143 are shown to be spaced apart, it may be desirable to have the polymer layer structured in such a way that after swelling, the swollen polymer layer 16 adjoins to the connection elements 113, 114 to eliminate any voids between the two wafers. This way, the swollen polymer layer 16 can protect the connection elements 113, 143 against moisture and corrosion.

Stacking the two wafers on top of each other facilitates a high level of system integration. Further, since the soldering, application of the polymer layers, structuring of the polymer layers, swelling of the polymer layers and drying of the polymer layers is done on the wafer level, the process can be applied to the many integrated circuits on the wafers in parallel. Accordingly, dicing of the wafers is carried out after the stacking of the two wafers.

FIG. 5 discloses schematically a further embodiment wherein the first substrate 201 is a semiconductor chip that is mounted to a second substrate 204 that in this embodiment is a printed circuit board. The semiconductor chip 201 is electrically connected to the copper pads 43 of PCB 204 through an array of solder bumps 13 that are rigidly attached to a first surface 211 of the semiconductor chip. The solder bumps 13 have been soldered to the copper pads 43.

The diameters of the solder bumps 13 are typically in the range of 50 to 200 micrometers; accordingly, the distance between the semiconductor chip 201 and the PCB 204 is of the same order. Therefore, when applying the polymer layer to either the semiconductor chip 201 or the PCB 204, the polymer layer should have a thickness of typically 70 to 90 percent of the bump diameters in order to have the polymer layer 15 bond well to either the semiconductor chip 201 or the PCB 204.

FIG. 5 discloses the polymer layer 16 after swelling and adhering to the semiconductor chip 201 and the PCB 204. The swollen polymer layer 16 may have been produced in a way as described in FIGS. 1a-1e or FIGS. 2a-2e. Preferably, to minimize costs, the polymer layer 16 has been applied to the semiconductor chip before the dicing of the wafer. The swelling of the polymer layer was carried out after, or during, the process of soldering the chip to the PCB.

In the application shown in FIG. 5, the swollen polymer layer 16 serves mainly two purposes: (a) it protects the connection elements 13, 43 from moisture and corrosion; and (b) it may absorb a significant fraction of the shearing forces that the semiconductor chip 201 and the PCB 204 exert on the connection elements 13, 43 due to the different CTE values of the silicon material (CTE=$3 \times 10^{-6}$ 1/K) and the PCB material (CTE=$17 \times 10^{-6}$ 1/K). Due to the large CTE difference, the semiconductor chip 201 and the PCB 204 expand and shrink at such different rates during thermal cycling that without the swollen polymer layer 16, the connection elements between the two substrates can break.

FIG. 6 discloses schematically a further embodiment wherein the first substrate 301 is a silicon chip and the second substrate 304 is an interposer. The interposer is meant to fan-out the densely disposed input/output terminals 13 (solder bumps) to allow for a larger connection pitch to the outside, represented by the larger solder balls 22. A larger connection pitch and larger solder balls 22 make it easier for a customer to mount the electronic device to a standard PCB with standard equipment. Typically, the diameter of the large solder balls 22 is in the order of 500 to 1000 micrometers.

Like in FIG. 5, semiconductor chip 301 is comprised with an array of solder balls 13 having diameters in a range of typically 50 to 200 micrometers. The semiconductor chip 301 is soldered onto the interposer 304 by soldering the solder balls 13 to the pads 43 of laminated to the interposer 304. In addition, the semiconductor chip 204 is held to the interposer 304 by means of the swollen polymer layer 16 adhering to the semiconductor chip 301 and the interposer 304. As described for FIG. 5, the swollen polymer layer 16 may have been applied to the semiconductor chip 301 on the wafer level, i.e. before dicing the wafer. The thickness of the polymer layer, before swelling, was chosen to be in the order of 50 to 100 micrometers, and to be smaller than the diameter of the solder bumps 13. This is to make sure that space remains for the polymer layer to swell between the semiconductor chip 301 and the interposer 304.

The interposer 304 of FIG. 6 includes one or more metallization layers for fanning out the signals from the semiconductor chip 301 to the solder balls 22 (or vice versa). In particular, interposer 304 may comprise one or several vias 24 in order to direct signals from the interposer surface 41 facing the semiconductor chip 301 to the opposite surface to which the large solder balls 22 are attached. The material of the interposer is preferably a laminate that has a CTE similar to the CTE of a PCB (not shown). This way, the shearing forces exerted by the PCB and the interposer 304 on the large solder bumps 22 during thermal cycling are negligible. As a consequence, it is not necessary to apply an underfill material between the PCB and the interposer 304 for stabilizing the system.

On the other hand, since the CTE of the semiconductor chip 301 and the CTE of the interposer 304 differ as much as in FIG. 5, a swollen polymer layer 16 is located between the semiconductor chip 301 and the interposer 304. Like for FIG. 5, the polymer layer 16 may have been applied to the semiconductor chip 301 on the wafer level, i.e. before the dicing of the respective wafer. Alternatively, the polymer layer 16 may have been applied to the interposer 304, or to the interposer 304 and the semiconductor chip 301. Later, after attaching the semiconductor chip 301 to the interposer 304, the polymer layer is made to swell to form the swollen polymer layer 16 that adheres to the semiconductor chip 301 and the interposer 304.

FIG. 6 discloses further mould material 20 encapsulating the semiconductor chip 304 to protect it from damaging mechanical or environmental influence. The molding material 20 is usually a resin that is applied in a mould at a temperature of about 150 degrees.

Figure 7:
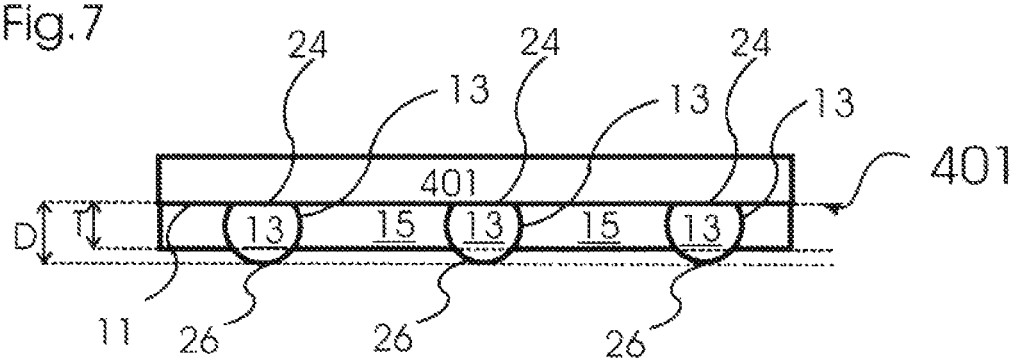
FIG. 7 discloses an embodiment wherein a non-swollen polymer layer adheres to a semiconductor chip.

FIG. 7 discloses a further embodiment wherein the substrate 401 is a semiconductor device comprising an array of connection elements 13 attached to a first surface 11 of the semiconductor device. The semiconductor device may be a naked semiconductor chip onto which the connection elements 13 have been attached by one of the conventional methods, as was explained in FIG. 5. Alternatively, the semiconductor device 401 may be a packaged semiconductor chip that has been mounted to a substrate or leadframe, and that has been encapsulated in a mould, as was explained in FIG. 6.

The connection elements 13 in FIG. 7 have each a proximal end 24 that is in direct connection with the first surface 11 of the semiconductor device 11, and a distal end 26 that represents the location of the connection element that is the furthest away from the proximal end 24. In FIG. 7, the distance D represents the distance between the proximal end 24 of a connection element and the distal end 26 of the connection element 26. The distance D defines the distance of the first surface 411 of the semiconductor device to the plane of a circuit board (not shown in FIG. 7) to which the semiconductor device 11 is to be mounted.

While FIG. 7 suggests that the connection elements are solder bumps, it should be noted that the embodiment also would work, if the connection elements 13 are pillars, pads or any other electrically conducting structure that is rigidly connected and protrudes vertically from the first surface 11.

FIG. 7 further discloses a swellable polymer layer 15 that is applied to the first surface 411. The polymer layer 15 has a thickness T that corresponds to about 80% of the distance D. This way, when soldering the semiconductor device 401 to a circuit board, the polymer layer 15 does not touch the circuit board. As a consequence, gaseous or fluid agents can be introduced into the gap between the polymer layer 15 and the circuit board in order to swell the polymer layer 15 until the polymer layer reaches and bonds to the surface of the circuit board. Once the polymer layer 15 has reached the circuit board, the connection elements 13 are encapsulated by the swollen polymer, which protects the connection elements against corrosion and possibly relieves the connection elements 13 from thermo-mechanical stress. Note that the process described in connection with FIG. 7 may be conducted in a similar way as described in FIGS. 1c-1e.

Note that in the embodiment of FIG. 7, the distal ends 26 of the connection elements 13 are electrically disconnected. This implies that semiconductor device 401 with the polymer layer 15 can be transported, sold and handled without being connected to a circuit board. This aspect is technically and commercially important since the production of semiconductor devices and the mounting of semiconductor devices to circuit boards is usually done by different manufacturers that are at different locations, and have different tools and equipment. Therefore, the application of a swellable polymer layer to semiconductor devices as a preparation for a more reliable assemblage of the semiconductor devices to a circuit board contributes significant value to the semiconductor devices.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package comprising:
a first substrate;
a second substrate over the first substrate;
multiple connection elements between a planar surface of the first substrate and a planar surface of the second substrate for electrically connecting the first substrate with the second substrate; and
a contracted polymer layer disposed between the first substrate and the second substrate which binds the first and second substrates together and holds the multiple connection elements in mechanical contact with one another to form solderless connections between the multiple connection element that electrically connect the first substrate with the second substrate, the contracted polymer layer being the sole means binding the first substrate to the second substrate, wherein the contracted polymer layer is contained between the first and second substrates and does not extend beyond the planar surface of the second substrate in a direction extending orthogonally from the planar surface of the first substrate toward the second substrate, and wherein a sidewall of the polymer layer protrudes from the first or second surface at an angle from 55 degrees to 120 degrees.

2. The electronic system according to claim 1 wherein the connection elements extend through the polymer layer.

3. The electronic system according to claim 1 wherein the polymer layer comprises an organic compound.

4. The electronic system according to claim 1 wherein the polymer layer comprises at least one of PMMA, polycarbonate, polyimide, polyurethane, polyvinyl chloride, and epoxy.

5. The electronic system according to claim 1 wherein the polymer layer is soluble in at least one of benzene, methyl chloride, acetone, ethyl acetate, methyl acetate, alcohol, terpenes, tetrachloroethylene, toluene, turpentine, and hexane.

6. The electronic system according to claim 1 wherein the polymer layer adheres to a first surface of the first substrate and a first surface of the second substrate.

7. The electronic system according to claim 1 wherein the connection elements are arranged in an array of lines and rows.

8. The electronic system according to claim 1 wherein the polymer layer is adapted to increase in volume by more than 5 Vol. %.

9. The electronic system according to claim 1 wherein the first substrate is at least one of a semiconductor wafer, a semiconductor chip, an integrated circuit, a ceramic containing substrate, a glass containing substrate, a laminate substrate, an encapsulated semiconductor chip, a silicon carrier, and a substrate comprising metal layers.

10. The electronic system according to claim 1 wherein the second substrate is at least one of a semiconductor wafer, a semiconductor chip, an integrated circuit, a ceramic containing substrate, a glass containing substrate, a laminate substrate, an encapsulated semiconductor chip, a silicon carrier, and a substrate comprising metal layers.

11. The electronic system according to claim 1 wherein the connection elements comprise at least one of connection pads, solder bumps, pillars, and stud bumps.

12. A semiconductor package comprising:
a first substrate;
a second substrate over the first substrate;
multiple connection elements between a planar surface of the first substrate and a planar surface of the second substrate for electrically connecting the first substrate with the second substrate;
a contracted polymer layer between the first substrate and the second substrate, the contracted polymer layer comprising at least one of PMMA, polycarbonate, and polyvinyl chloride, wherein the contracted polymer layer binds the first and second substrates together and holds the multiple connection elements in mechanical contact with one another to form solderless connections between the multiple connection element that electrically connect the first substrate with the second substrate, the contracted polymer layer being the sole means binding the first substrate to the second substrate, wherein the contracted polymer layer is contained between the first and second substrates and does not extend beyond the planar surface of the second substrate in a direction extending orthogonally from the planar surface of the first substrate toward the second substrate, and wherein a sidewall of the polymer layer protrudes from the first or second surface at an angle from 55 degrees to 120 degrees.

13. The electronic system according to claim 12 wherein the connection elements extend through the polymer layer.

14. The electronic system according to claim 12 wherein the polymer layer adheres to a first surface of the first substrate and a first surface of the second substrate.

15. The electronic system according to claim 12 wherein the connection elements are arranged in an array of lines and rows.

16. The electronic system according to claim 12 wherein the polymer layer is adapted to increase in volume by more than 5 Vol. %.

17. The electronic system according to claim 12 wherein the first substrate is at least one of a semiconductor wafer, a semiconductor chip, an integrated circuit, a ceramic containing substrate, a glass containing substrate, a laminate substrate, an encapsulated semiconductor chip, a silicon carrier, and a substrate comprising metal layers.

18. The electronic system according to claim 12 wherein the second substrate is at least one of a semiconductor wafer, a semiconductor chip, an integrated circuit, a ceramic containing substrate, a glass containing substrate, a laminate substrate, an encapsulated semiconductor chip, a silicon carrier, and a substrate comprising metal layers.

19. The electronic system according to claim 12 wherein the connection elements comprise at least one of connection pads, solder bumps, pillars, and stud bumps.

20. A semiconductor package comprising:
a first substrate having a first plurality of connection elements extending from a major surface;
a second substrate having a second plurality of connection elements extending from a major surface, wherein the second substrate is positioned over the first substrate so that each of the connection elements of the second plurality of connection elements aligns with a corresponding one of the connection elements of the first plurality of connection elements; and
a contracted polymer layer between the first substrate and the second substrate, wherein the contracted polymer layer binds the first and second substrates together and holds each of the connection elements of the second plurality of connection elements in mechanical contact against the corresponding one of the connection elements of the first plurality of the connection elements to form solderless connection between and the first plurality and second plurality of connection elements to electrically connect the first substrate with the second substrate, the contracted polymer layer being the sole means binding the first substrate to the second substrate, wherein the contracted polymer layer is contained between the major surfaces of the first and second substrates and does not extend beyond the major surface of the second substrate in a direction extending orthogonally from the major surface of the first substrate toward the second substrate, and wherein a sidewall of the polymer layer protrudes from the first or second surface at an angle from 55 degrees to 120 degrees.

21. The electronic system of claim 20, wherein the connection elements comprise copper coated with a layer of gold.

* * * * *